(12) United States Patent
Lee

(10) Patent No.: US 8,630,119 B2
(45) Date of Patent: Jan. 14, 2014

(54) METHOD FOR OPERATING NON-VOLATILE MEMORY DEVICE

(75) Inventor: Hee-Youl Lee, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 230 days.

(21) Appl. No.: 13/304,569

(22) Filed: Nov. 25, 2011

(65) Prior Publication Data

US 2012/0294091 A1    Nov. 22, 2012

(30) Foreign Application Priority Data

May 20, 2011    (KR) .................. 10-2011-0047961

(51) Int. Cl.
*G11C 16/06* (2006.01)
(52) U.S. Cl.
USPC .................................. 365/185.17; 365/185.2
(58) Field of Classification Search
USPC ................ 365/185.17, 185.2, 210.1
See application file for complete search history.

(56) References Cited

U.S. PATENT DOCUMENTS

| 7,652,926 B2 * | 1/2010 | Kang et al. ................. 365/185.2 |
| 2006/0239077 A1 * | 10/2006 | Park et al. ................ 365/185.17 |
| 2012/0206968 A1 * | 8/2012 | Shiino et al. ............. 365/185.17 |

FOREIGN PATENT DOCUMENTS

| KR | 1020110001572 | 1/2011 |
| KR | 1020110034068 | 4/2011 |

OTHER PUBLICATIONS

Notice of Allowance issued by the Korean Intellectual Property Office on Jan. 28, 2013.
Office Action issued by the Korean Intellectual Property Office on Jul. 24, 2012.

* cited by examiner

*Primary Examiner* — Vu Le
(74) *Attorney, Agent, or Firm* — IP & T Group LLP

(57) ABSTRACT

A method for operating a non-volatile memory device which includes a plurality of memory cells serially coupled between a source selection transistor and a drain selection transistor, a first dummy memory cell coupled between the source selection transistor and the memory cells, and a second dummy memory cell coupled between the drain selection transistor and the memory cells includes applying a verification voltage to a gate of a selected memory cell, applying a first voltage to gates of unselected memory cells, and applying a second voltage that is lower than the first voltage to a gate of at least one of the first dummy memory cell and the second dummy memory cell, during a program verification operation.

13 Claims, 7 Drawing Sheets

ERASE CELL

PROGRAM CELL

METHOD FOR OPERATING NON-VOLATILE MEMORY DEVICE

CROSS-REFERENCE TO RELATED APPLICATIONS

The present application claims priority of Korean Patent Application No. 10-2011-0047961, filed on May 20, 2011, which is incorporated herein by reference in its entirety.

BACKGROUND

1. Field

Exemplary embodiments of the present invention relate to a method for operating a non-volatile memory device, and more particularly, to a non-volatile memory device performing a program verification operation and a read operation.

2. Description of the Related Art

There are increasing demands for non-volatile memory devices that may perform electrical program and erase operations and retain programmed data without a refresh function which re-writes a data periodically. Among the non-volatile memory devices is a NAND-type flash memory device that may store a large amount of data because adjacent memory cells share a drain or a source by coupling a plurality of memory cells in series to form a cell string.

FIG. 1 is a circuit diagram illustrating a memory cell array of a conventional non-volatile memory device.

Referring to FIG. 1, the memory cell array includes a bit line BLn, a common source line CSL, a drain selection transistor DST, memory cells MC0 to MCn, and a source selection transistor SST. The drain selection transistor DST, the memory cells MC0 to MCn, and the source selection transistor SST are serially coupled between the bit line BLn and the common source line CSL. Although one bit line BLn is shown in the drawing, the memory cell array may include a plurality of bit lines in parallel.

A gate of the drain selection transistor DST is coupled with and controlled by a drain selection line DSL, and a gate of the source transistor SST is coupled with and controlled by a source selection line SSL. The control gates of the memory cells MC0 to MCn are coupled with and controlled by word lines WL0 to WLn, respectively.

Writing a data into each of the memory cells MC0 to MCn of the non-volatile memory device is referred to as a program operation.

Here, during a program operation, to verify whether the data is properly written in each of the memory cells MCD to MCn, a program verification operation is to be performed for a corresponding memory cell whenever a program operation is performed for each of the memory cells MC0 to MCn.

Meanwhile, an operation of reading the data from a selected memory cell after the program operation is performed for all of the memory cells MC0 to MCn is referred to as a read operation. In the read operation, the voltage level applied to the drain selection transistor DST, the source selection transistor SST, and the unselected memory cells is substantially the same as the program verification operation.

However, since program states of the unselected memory cells on one side or both sides of a selected memory cell during the read operation are different from those during the program verification operation, the use of the same voltage in the read operation and the program verification operation may lead to an error in the read operation. This will be described in detail later on by referring to FIGS. 2A to 5.

FIGS. 2A and 2B illustrate the voltage applied to the non-volatile memory device of FIG. 1 depending on an operation mode and the program state of each memory cell. FIGS. 3A and 3B illustrate a difference between the program states of the memory cells. FIG. 4 is a graph showing a variation of a current flowing through a selected memory cell of FIGS. 2A and 2B depending on an operation mode. FIG. 5 is a graph showing a threshold voltage distribution of the selected memory cell shown in FIG. 2B during a read operation. The drawings of FIGS. 2A to 5 show a case where a program operation is performed sequentially from the memory cells on the part of a source to the memory cells on the part of a drain.

Referring to FIG. 2A, a verification voltage Vverify is applied to a word line WL0 coupled with a selected memory cell MCi, and a high voltage Vread1 having a predetermined voltage level is applied to the word lines WL1 to WLn that are respectively coupled with unselected memory cells during a program verification operation. In this state, the data of the selected memory cell MCi may be read by sensing a current flowing through the selected memory cell MCi.

Referring to FIG. 2B, a read voltage Vread is applied to the word line WL0 coupled with the selected memory cell MCi, and the high voltage Vread1 having a predetermined voltage level is applied to the word lines WL1 to WLn that are respectively coupled with unselected memory cells during a read operation. In this state, the data of the selected memory cell MCi may be read by sensing a current flowing through the selected memory cell MCi.

Here, the program verification operation is performed following every program operation that is performed onto each memory cell. As described above, the program operation is performed from the memory cells in the lower part. Therefore, when a program verification operation is performed after the selected memory cell MCi of the lowermost part is programmed, for example, with '01', all the unselected memory cells are in erased states, for example, as '11'.

On the other hand, the read operation is performed onto a memory cell selected after the program operation is performed onto all memory cells. Therefore, the selected memory cell MCi of the lowermost part is in a programmed state as '01' and the unselected memory cells are also in programmed states. For example, all the unselected memory cells may be in programmed states with '00'.

Referring to FIGS. 3A and 3B, cell threshold voltage Vtcell is lower and drain current Id is higher when a memory cell is in an erased state (see FIG. 3A) than when a memory cell in a programmed state (see FIG. 3B). Therefore, it may be seen that when a memory cell is in an erased state (see FIG. 3A), channel resistance Rcell is low.

This signifies that the channel resistance of the unselected memory cells in the upper part of the selected memory cell MCi during the program verification operation shown in FIG. 2A is lower than the channel resistance of the unselected memory cells in the upper part of the selected memory cell MCi during the read operation shown in FIG. 2B. In short, a resistor of relatively low resistance is coupled with a drain side of the selected memory cell MCi during a program verification operation, and a resistor of relatively high resistance is coupled with a drain side of the selected memory cell MCi during a read operation.

Therefore, as shown in FIG. 4, although the same high voltage Vread1 is applied to the unselected memory cells during a program verification operation and a read operation, the current (see curve B) flowing through the selected memory cell MCi during the read operation may be greatly lower than the current (see curve A) flowing through the selected memory cell MCi during the program verification operation. This signifies that the threshold voltage distribution of the selected memory cell MCi during a read operation becomes wider than the threshold voltage distribution of the selected memory cell MCi during the program verification operation.

Referring to FIG. 5, as described above, the distribution of the threshold voltage Vth of the selected memory cell MCi during the read operation becomes wide and accordingly the threshold voltage Vth of the selected memory cell MCi may become higher than a predetermined maximal threshold voltage level. Therefore, read margin may be decreased. Decreased read margin signifies that it is difficult to accurately read the program state of the selected memory cell, which eventually brings about an error in the read operation.

To sum up, according to the prior art, channel resistance becomes different based on the program state of the unselected memory cells during a program verification operation and a read operation, and accordingly, the current flowing through the selected memory cell during the read operation becomes lower than the current flowing through the selected memory cell during the program verification operation. Thus, read margin is decreased, which may bring about an error in the read operation.

SUMMARY

An embodiment of the present invention is directed to a method for operating a non-volatile memory device that may increase the read margin of a memory cell and increase the reliability of a read operation by decreasing the variation of channel resistance between a program verification operation and a read operation.

In accordance with an embodiment of the present invention, a method for operating a non-volatile memory device which includes a plurality of memory cells serially coupled between a source selection transistor and a drain selection transistor; a first dummy memory cell coupled between the source selection transistor and the memory cells; and a second dummy memory cell coupled between the drain selection transistor and the memory cells includes: applying a verification voltage to a gate of a selected memory cell, applying a first voltage to gates of unselected memory cells, and applying a second voltage that is lower than the first voltage to a gate of at least one of the first dummy memory cell and the second dummy memory cell, during a program verification operation.

In accordance with another embodiment of the present invention, a method for operating a non-volatile memory device, which includes a plurality of memory cells serially coupled between a source selection transistor and a drain selection transistor, a first dummy memory cell coupled between the source selection transistor and the memory cells, and a second dummy memory cell coupled between the drain selection transistor and the memory cells, includes: applying a second voltage to a gate of at least one of the first and second dummy memory cells during a program verification operation; and applying a first voltage that is higher than the second voltage to the gates of the first and second dummy memory cells during a read operation.

DETAILED DESCRIPTION

Figure 1:
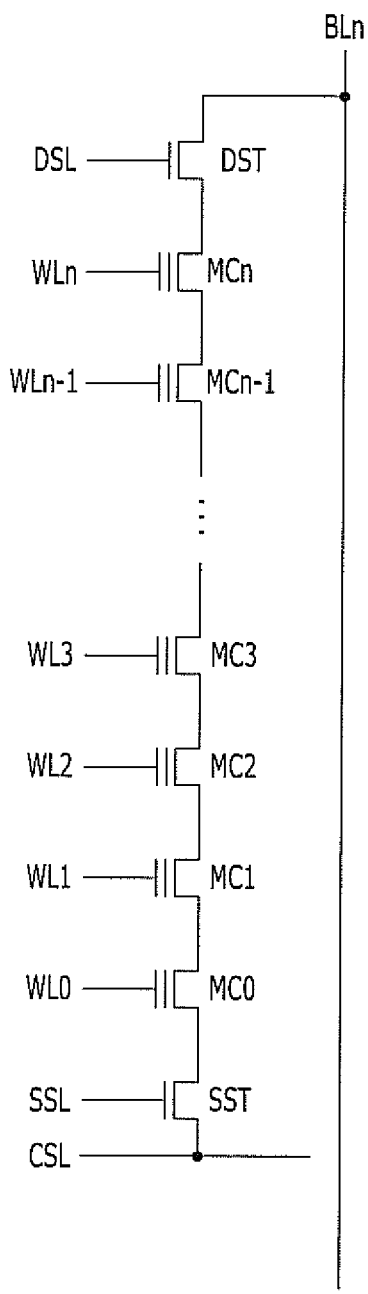
FIG. 1 is a circuit diagram illustrating a memory cell array of a conventional non-volatile memory device.
Figure 2A:
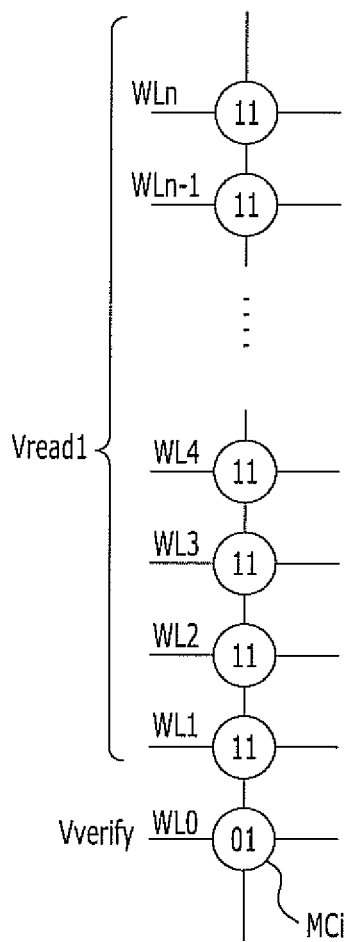
FIGS. 2A and 2B illustrate the voltage applied to the non-volatile memory device of FIG. 1 depending on an operation mode and the program state of each memory cell.
Figure 2B:
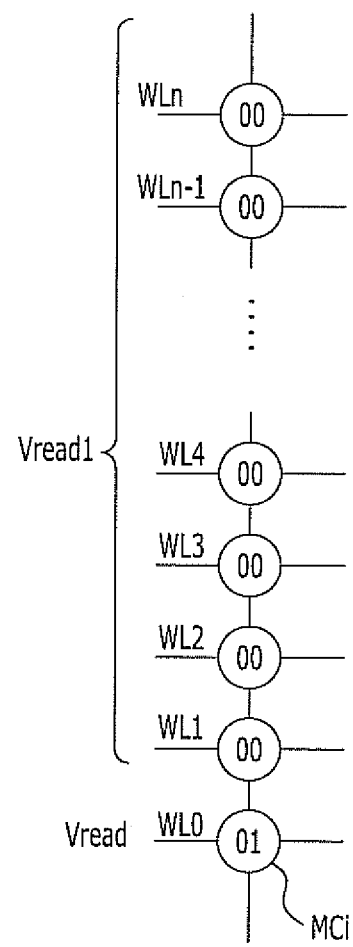

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 6:
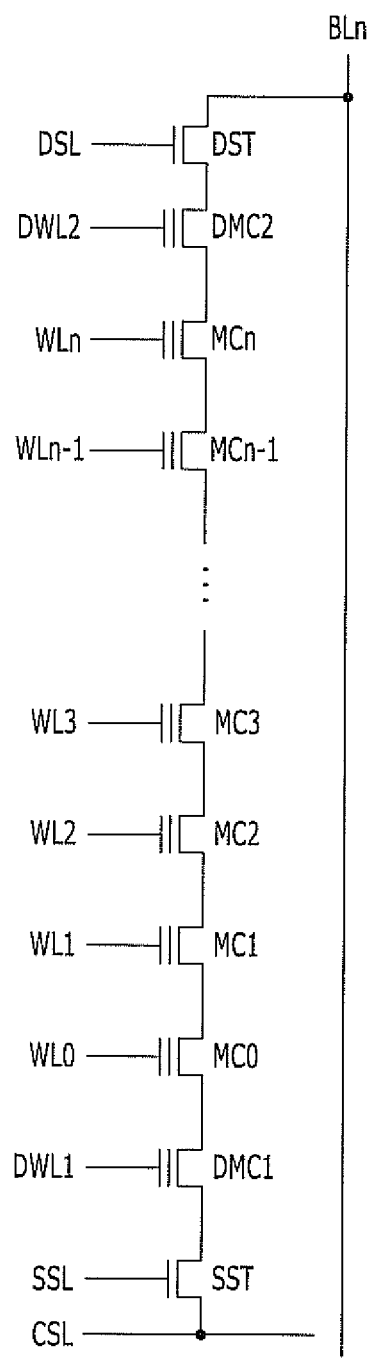
FIG. 6 illustrates a memory cell array of a non-volatile memory device in accordance with an embodiment of the present invention.

FIG. 6 illustrates a memory cell array of a non-volatile memory device in accordance with an embodiment of the present invention.

Referring to FIG. 6, the memory cell array includes a bit line BLn, a common source line CSL, a drain selection transistor DST, a second dummy memory cell DMC2, memory cells MC0 to MCn, a first dummy memory cell DMC1, and a source selection transistor SST. Here, the drain selection transistor DST, the second dummy memory cell DMC2, the memory cells MC0 to MCn, the first dummy memory cell DMC1, and the source selection transistor SST that are coupled in series between the bit line BLn and the common source line CSL may be referred to as a cell string.

In this embodiment of the present invention, one bit line BLn and one cell string coupled with the bit line BLn are illustrated, but the scope and spirit of the present invention are not limited to it and the memory cell array may further include a plurality of bit lines in parallel and a plurality of cell strings first ends of which are coupled with the multiple bit lines, respectively. The common source line CSL may be coupled in common with second ends of the cell strings.

A gate of the drain selection transistor DST is coupled with and controlled by the drain selection line DSL. The drain selection line DSL may be stretched in one direction while coupling the gates of the drain selection transistors DST of cell strings.

A gate of the source selection transistor SST is coupled with and controlled by the source selection line SSL. The source selection line SSL may be stretched in one direction while coupling the gates of the source selection transistors SST of cell strings.

Each of the memory cells MC0 to MCn include a floating gate and a control gate that are stacked up and down and are insulated from each other. As a charge is inputted to the floating gates of the memory cells MC0 to MCn, a data may be stored. The control gates of the memory cells MC0 to MCn are coupled with and controlled by word lines WL0 to WLn, respectively. Each of the word lines WL0 to WLn may be stretched in one direction while coupling the control gates of the corresponding memory cells of the cell strings.

The first dummy memory cell DMC1 and the second dummy memory cell DMC2 are memory cells that have substantially the same structure as the memory cells MC0 to MCn but do not perform the function as a memory cell, which is a data storage function. In other words, the first dummy memory cell DMC1 and the second dummy memory cell DMC2 include a floating gate and a control gate that are stacked up and down and are insulated from each other, but the floating gates of the first dummy memory cell DMC1 and the second dummy memory cell DMC2 are controlled not to receive a charge applied thereto. The control gates of the first dummy memory cell DMC1 and the second dummy memory cell DMC2 are coupled with and controlled by a first dummy word line DWL1 and a second dummy word line DWL2, respectively. The first dummy word line DWL1 and the second dummy word line DWL2 may be stretched in one direction while coupling the control gates of the first dummy memory cells DMC1 and the second dummy memory cells DMC2 of the cell strings, respectively.

The first dummy memory cell DMC1 and the second dummy memory cell DMC2 are disposed between the source selection transistor SST and the memory cells MC0 to MCn and between the drain selection transistor DST and the memory cells MC0 to MCn, as described above, to enhance the cell operation properties, particularly, to enhance the read operation properties by adjusting a bias applied to the control gates of the first and second dummy memory cells DMC1 and DMC2, which will be described below.

Hereafter, the program verification operation and the read operation of the above-described non-volatile memory device are described with reference to FIGS. 7A and 7B. It is described as an example that the program operation of the non-volatile memory device is sequentially performed from the memory cells on the part of a source, i.e., a memory cell MC0, to the memory cells on the part of a drain, i.e., a memory cell MCn. It is also described as an example that the program verification operation of the non-volatile memory device is performed every time when a program operation is performed onto each of the memory cells MC0 to MCn, and the read operation is performed onto a selected memory cell after the program operation is performed onto all of the memory cells MC0 to MCn.

Figure 7A:
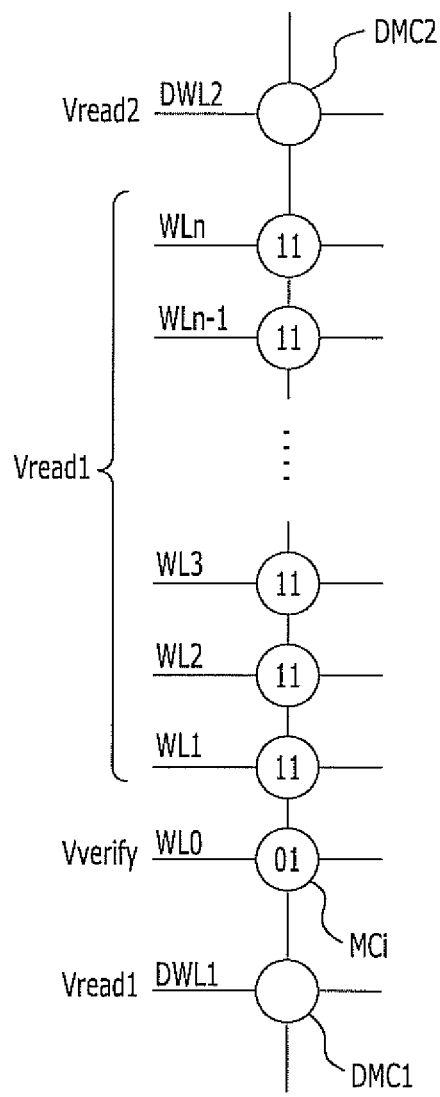
FIGS. 7A and 7B illustrate a method for operating a non-volatile memory device in accordance with an embodiment of the present invention.
Figure 7B:
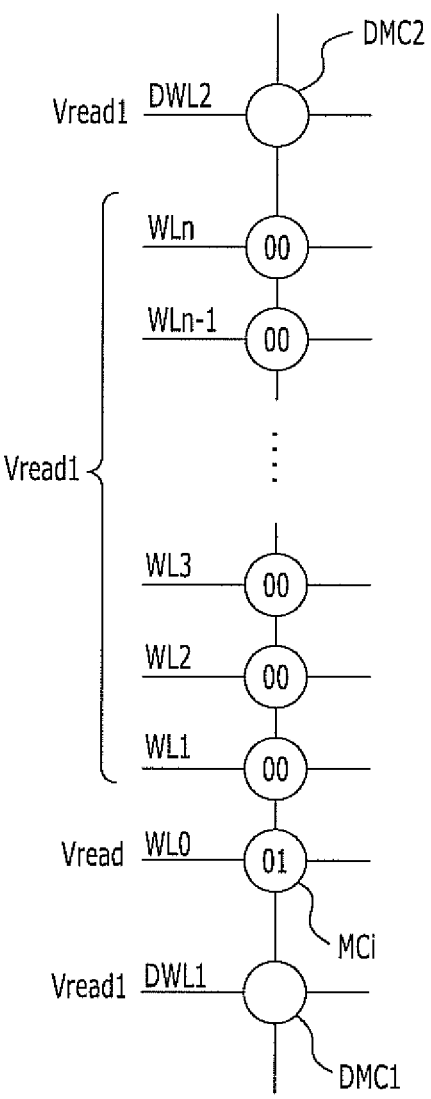

FIGS. 7A and 7B illustrate a method for operating a non-volatile memory device in accordance with an embodiment of the present invention. In particular, FIG. 7A illustrates a program verification operation, and FIG. 7B illustrates a read operation.

Referring to FIGS. 7A and 7B, the program verification operation may be performed after a selected memory cell MCi is programmed, for example, after only the selected memory cell MCi is programmed with '01'. On the other hand, the read operation may be performed onto the selected memory cell MCi after the program operation is performed onto all of the memory cells.

Here, since the program operation begins from the memory cells on the part of a source, the unselected memory cells disposed on the part of a drain from the selected memory cell MCi during the program verification operation are all in an erased state, which is '11', during the program verification operation. On the other hand, all of the memory cells are in a programmed state during the read operation. In this embodiment of the present invention, all the unselected memory cells are in the programmed state of '00', but the present invention is not limited to it and the unselected memory cells during the read operation may be in different program states, for example, they may be programmed as any one of '00', '01', and '10' or they may be in an erased state of '11'.

Figure 3A:
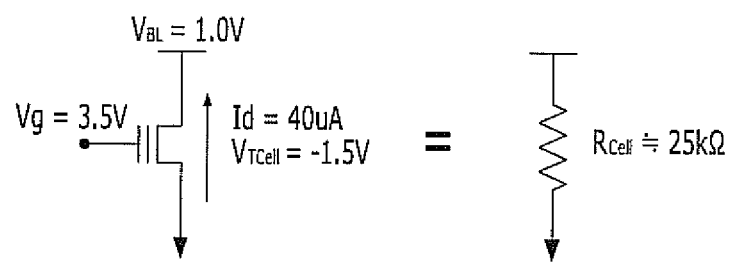
FIGS. 3A and 3B illustrate a difference between the program states of a memory cell.
Figure 3B:
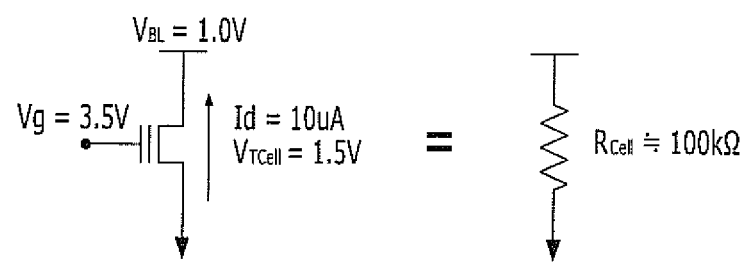

In this case, since the channel resistance of the memory cell having an erased state is relatively smaller than the channel resistance of a memory cell in a programmed state, as described in the prior art (see FIG. 3), the channel resistances of the unselected memory cells disposed on the part of a drain from the selected memory cell MCi are relatively smaller during a program verification operation than during a read operation. In other words, whereas a resistor of relatively low resistance is coupled with a drain side of the selected memory cell MCi during the program verification operation, a resistor of relatively high resistance is coupled with a drain side of the selected memory cell MCi during the read operation. The difference in the channel resistances may bring about an error in the read operation, as described in the prior art, and the difference in the channel resistances is to be minimized.

Therefore, in the embodiment of the present invention, a voltage is applied in the following method during a program verification operation and a read operation.

During a program verification operation, a verification voltage Vverify is applied to a word line WL0 coupled with the selected memory cell MCi; a relatively high voltage of a predetermined voltage level, which is a first voltage Vread1 higher than the verification voltage Vverify, is applied to the word lines WL1 to WLn respectively coupled with the unselected memory cells; and the same voltage as the voltage applied to the word lines WL1 to WLn, which is the first voltage Vread1, is applied to a first dummy word line DWL1 coupled with a first dummy memory cell DMC1 on the part of the source. Furthermore, a second voltage Vread2 that is lower than a voltage which is applied to a second dummy word line DWL2 during the read operation, for example, the first voltage Vread1, is applied to the second dummy word line DWL2. The second voltage Vread2 may be lower than the first voltage Vread1 applied to the word lines WL1 to WLn respectively coupled with the unselected memory cells, and accordingly, it may be higher than the verification voltage Vverify. In such a voltage application condition, the data of the selected memory cell MCi may be read by sensing a current flowing through the selected memory cell MCi.

Also, during the read operation, a read voltage Vread is applied to a word line WL0 coupled with the selected memory cell MCi; the first voltage Vread1 is applied to the word lines WL1 to WLn respectively coupled with the unselected memory cells; and the same voltage as the voltage applied to the word lines WL1 to WLn, which is the first voltage Vread1, is applied to the first dummy word line DWL1 and the second dummy word line DWL2 that are coupled with the first dummy memory cell DMC1 on the part of the source and the second dummy memory cell DMC2 on the part of the drain, respectively.

The first voltage Vread1 may be higher than the read voltage Vread. In this voltage application condition, the data of the selected memory cell MCi may be read by sensing a current flowing through the selected memory cell MCi.

To clearly understand the level relationship among the verification voltage Vverify, the read voltage Vread, the first voltage Vread1, and the second voltage Vread2, they are represented as follows:

$$\text{Vverify (or Vread)} < \text{Vread2} < \text{Vread1} \qquad \text{Equation 1}$$

As described above, when the second voltage Vread2, which is lower than the voltage, e.g., the first voltage Vread1, applied to the second dummy word line DWL2 coupled with the second dummy memory cell DMC2 on the part of the drain during the read operation, is applied to the second dummy word line DWL2 during the program verification operation, a turn-on current flowing through the second dummy memory cell DMC2 during the program verification operation is less than a turn-on current flowing through the second dummy memory cell DMC2 during the read operation. This signifies that the channel resistance of the second dummy memory cell DMC2 during the program verification operation is higher than the channel resistance of the second dummy memory cell DMC2 during the read operation. Therefore, although there are erased cells on the part of the drain of the selected memory cell MCi during the program verification operation, the channel resistance on the part of the drain may become similar during the program verification operation and the read operation. Furthermore, the second voltage Vread2 applied to the second dummy word line DWL2 coupled with the second dummy memory cell DMC2 on the part of the drain during the program verification operation may be lower than the voltage, e.g., the first voltage Vread1, that is applied to the word lines WL1 to WLn respectively coupled with the unselected memory cells during the program operation. In this case, the channel resistance on the part of the drain of the selected memory cell MCi may be increased higher than that of the prior art.

In consequences, according to the embodiment of the present invention, the difference between the channel resistance on the part of the drain of the selected memory cell MCi during the read operation and the channel resistance on the part of the drain of the selected memory cell MCi during the program verification operation may be decreased. Therefore, the malfunctions may be prevented from occurring. This will be described in detail with reference to FIG. 8, hereafter.

Figure 8:
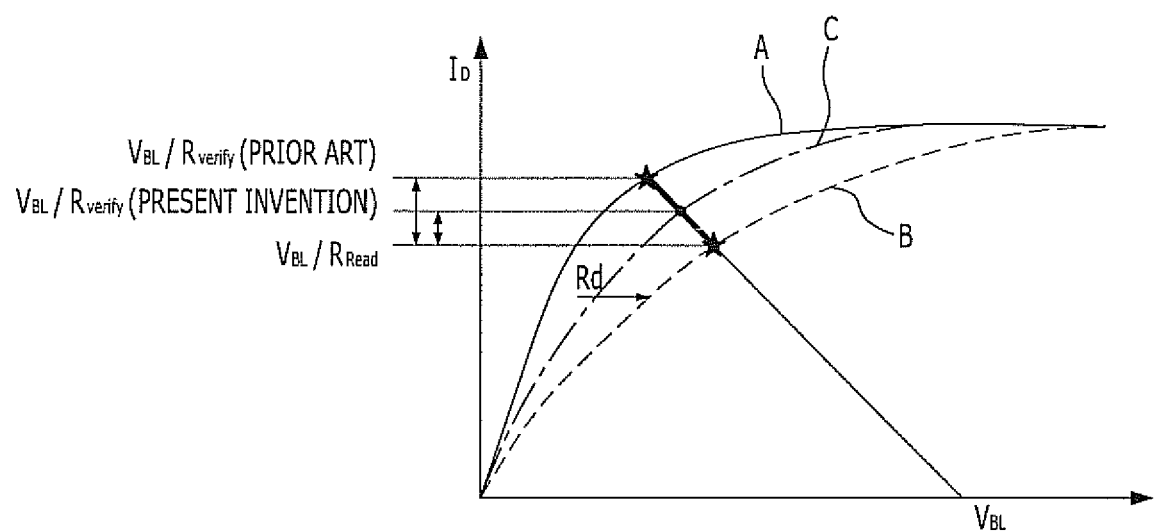
FIG. 8 is a graph comparing selected memory cell currents generated through the non-volatile memory device operating method according to an embodiment of the present invention and a conventional non-volatile memory device operating method.

FIG. 8 is a graph comparing selected memory cell currents generated through the non-volatile memory device operating method according to an embodiment of the present invention and a conventional non-volatile memory device operating method.

Figure 4:
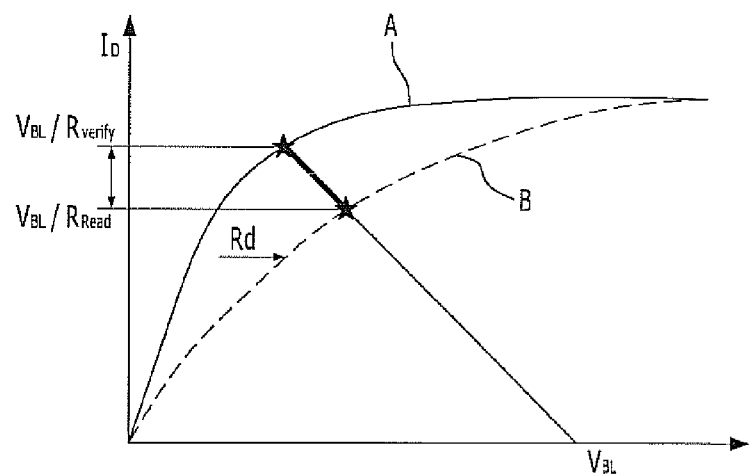
FIG. 4 is a graph showing a variation of a current flowing through a selected memory cell of FIGS. 2A and 2B depending on an operation mode.
Figure 5:
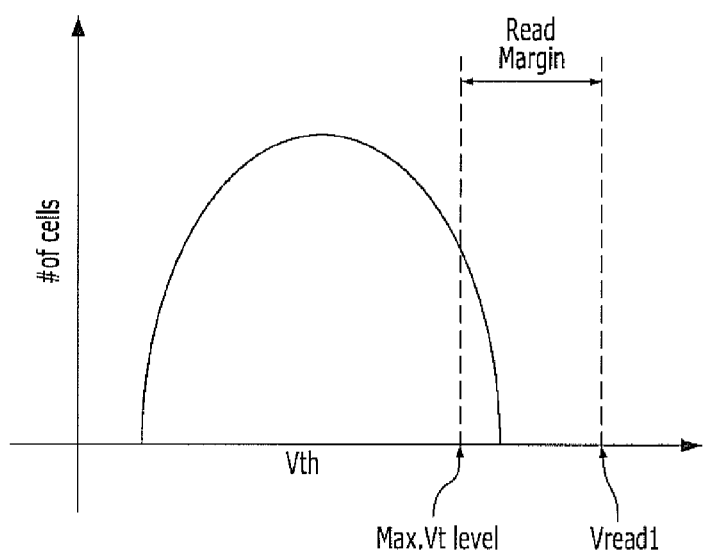
FIG. 5 is a graph showing a threshold voltage distribution of the selected memory cell shown in FIG. 2B during a read operation.

In the graph, a curve A indicates the variation of a current flowing through the selected memory cell MCi during a program verification operation (see FIG. 4) according to the prior art. A curve B indicates the variation of a current flowing through the selected memory cell MCi during a read operation (see FIG. 4) according to the prior art. According to an embodiment of the present invention, since the voltages are applied to the word lines during a read operation under the same conditions as that of the prior art, the curve B may represent the variation of a current flowing through the selected memory cell MCi during a read operation in accordance with an embodiment of the present invention. A curve C represents the variation of a current flowing through the selected memory cell MCi during a program verification operation in accordance with an embodiment of the present invention.

Referring to FIG. 8, according to the prior art, the difference between the current (see curve B) flowing through the selected memory cell MCi during a read operation and the current (see curve A) flowing through the selected memory cell MCi during a program verification operation is relatively great. On the other hand, according to an embodiment of the present invention, the current (see curve C) flowing through the selected memory cell MCi during a program verification operation is decreased, compared with the current (see curve A) according to the prior art. In consequences, according to the embodiment of the present invention, the difference between the current (see curve B) flowing through the selected memory cell MCi during the read operation and the current (see curve C) flowing through the selected memory cell MCi during the program verification operation is relatively small.

Therefore, according to the embodiment of the present invention, an increase in the threshold voltage distribution of the selected memory cell MCi during the read operation, compared with during the program verification operation, is reduced, and accordingly, a decrease in the read margin may be decreased so as to increase the reliability of the read operation after all.

Meanwhile, the above embodiments are described as an example that a program operation of a non-volatile memory device is sequentially performed from the memory cell on the part of a source, which is a memory cell MC0, to the memory cell on the part of a drain, which is a memory cell MCn.

However, if necessary, the program operation of a non-volatile memory device may be randomly performed, the program operation may be performed more than twice onto one memory cell, or the program operation of a non-volatile memory device is sequentially performed from the memory cell on the part of a drain to the memory cell on the part of a source.

In this case, some or the entire memory cells among the unselected memory cells disposed on the part of a source from a selected memory cell during a program verification operation may be in an erased state, or some or the entire memory cells among the unselected memory cells disposed on both sides of a selected memory cell may be in an erased state. On the other hand, the read operation is performed after a program operation is performed onto all of the memory cells, as described above.

The above-described present invention may be applied the same to this case.

For example, when at least a portion of the unselected memory cells disposed on the part of a source from a selected memory cell during a program verification operation is in an erased state, a resistor of a relatively lower resistance is coupled with the part of a source of a selected memory cell during the program verification operation than during the read operation when all of the memory cells are in a programmed state. Therefore, a second voltage Vread2 and a first voltage Vread1 higher than the second voltage Vread2 may be applied to a first dummy word line DWL1 coupled with a first dummy memory cell DMC1 on the part of a source during the program verification operation and the read operation, respectively and the first voltage Vread1 may be applied to the word lines WL0 to WLn coupled with the unselected memory cells during the program verification operation.

For example, when at least a portion of the unselected memory cells disposed on both sides of a selected memory cell is in an erased state during a program verification operation and all the memory cells are in a programmed state during a read operation, it may be seen that a resistor of a relatively low resistance is coupled with the parts of a source and a drain of a selected memory cell during the program verification operation than during the read operation. Therefore, a second voltage Vread2 may be applied to the first dummy word line DWL1 coupled with the first dummy memory cell DMC1 on the part of a source and the second dummy word line DWL2 coupled with the second dummy memory cell DMC2 on the part of a drain during the program verification operation, a first voltage Vread1 higher than the second voltage Vread2 may be applied to the first and second dummy word line DWL1 and DWL2 during the read operation or applied to the word lines WL0 to WLn coupled with the unselected memory cells during the program verification operation.

To sum up, the resistance on the part of a source or on the part of a drain of the selected memory cell during the program verification operation may not be greater than the resistance on the part of the source or on the part of the drain of the selected memory cell during the read operation. Therefore, the resistance is increased by a relatively small amount during a program verification operation by reducing the voltage applied to a dummy memory cell on the part of a source or a dummy memory cell on the part of a drain during the program verification operation lower than the voltage applied during the read operation.

According to an embodiment of the present invention, the reliability of a read operation may be increased by decreasing the variation of channel resistance between a program verification operation and a read operation and increasing the read margin of a memory cell.

While the present invention has been described with respect to the specific embodiments, it will be apparent to those skilled in the art that various changes and modifications may be made without departing from the spirit and scope of the invention as defined in the following claims.

What is claimed is:

1. A method for operating a non-volatile memory device which comprises a plurality of memory cells serially coupled between a source selection transistor and a drain selection transistor; a first dummy memory cell coupled between the source selection transistor and the memory cells; and a second dummy memory cell coupled between the drain selection transistor and the memory cells, comprising:
   applying a verification voltage to a gate of a selected memory cell;
   applying a first voltage to gates of unselected memory cells; and
   applying a second voltage that is lower than the first voltage to a gate of at least one of the first dummy memory cell and the second dummy memory cell, during a program verification operation.

2. The method of claim 1, further comprising:
   applying the first voltage to the gates of the first and the second dummy memory cells during a read operation.

3. The method of claim 1, wherein the second voltage is applied to the gate of the second dummy memory cell and the first voltage is applied to the gate of the first dummy memory cell during the program verification operation.

4. The method of claim 1, wherein the second voltage is applied to the gate of the first dummy memory cell and the first voltage is applied to the gate of the second dummy memory cell during the program verification operation.

5. The method of claim 1, wherein the second voltage is applied to the gates of the first and second dummy memory cells during the program verification operation.

6. The method of claim 1, wherein the verification voltage is lower than the second voltage.

7. The method of claim 2, wherein a read voltage lower than the second voltage is applied to the gate of the selected memory cell during the read operation.

8. A method for operating a non-volatile memory device which comprises a plurality of memory cells serially coupled between a source selection transistor and a drain selection transistor, a first dummy memory cell coupled between the source selection transistor and the memory cells, and a second dummy memory cell coupled between the drain selection transistor and the memory cells, comprising:
   applying a second voltage to a gate of at least one of the first and second dummy memory cells during a program verification operation; and
   applying a first voltage that is higher than the second voltage to the gates of the first and second dummy memory cells during a read operation.

9. The method of claim 8, further comprising:
   applying a verification voltage and the first voltage to a gate of a selected memory cell and gates of unselected memory cells, respectively, during the program verification operation, and
   applying a read voltage and the first voltage to the gate of the selected memory cell and the gates of the unselected memory cells, respectively, during the read operation.

10. The method of claim 8, wherein the second voltage is applied to the gate of the second dummy memory cell and the first voltage is applied to the gate of the first dummy memory cell during the program verification operation.

11. The method of claim 8, wherein the second voltage is applied to the gate of the first dummy memory cell and the first voltage is applied to the gate of the second dummy memory cell during the program verification operation.

12. The method of claim 8, wherein the second voltage is applied to the gates of the first and second dummy memory cells during the program verification operation.

13. The method of claim 9, wherein the read voltage and the verification voltage are lower than the second voltage.

* * * * *